(12) United States Patent
Scott

(10) Patent No.: US 7,123,009 B1
(45) Date of Patent: Oct. 17, 2006

(54) SYNCHRONIZATION OF WIRELESS TRANSMITTED MRI SIGNALS IN MRI SYSTEM

(75) Inventor: Greig C. Scott, Palo Alto, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 11/233,669

(22) Filed: Sep. 22, 2005

(51) Int. Cl.
*G01V 3/00* (2006.01)

(52) U.S. Cl. ........................ 324/311; 324/314

(58) Field of Classification Search ............. 324/311, 324/322
See application file for complete search history.

(56) References Cited

U.S. PATENT DOCUMENTS

| | | | |
|---|---|---|---|
| 5,245,288 A | * | 9/1993 | Leussler .................... 324/322 |
| 5,442,292 A | * | 8/1995 | Kolem et al. ............... 324/322 |
| 6,261,247 B1 | * | 7/2001 | Ishikawa et al. ........... 600/587 |
| 6,791,322 B1 | * | 9/2004 | Vester ........................ 324/309 |
| 6,906,520 B1 | * | 6/2005 | Heid et al. .................. 324/322 |

* cited by examiner

*Primary Examiner*—Diego Gutierrez
*Assistant Examiner*—Megann E Vaughn
(74) *Attorney, Agent, or Firm*—Beyer Weaver & Thomas LLP

(57) ABSTRACT

In a MRI system having a FID detector unit and a computer unit for processing FID signals, phase errors introduced into the FID signal at the detector unit are corrected at the computer unit by transmitting a pilot signal from the computer unit to the detector unit, processing the pilot unit along with a detected FID signal at the detector unit, transmitting the processed signals to the computer unit, obtaining the pilot signal and FID signal at the computer unit, and combining the pilot signal and the FID signal whereby phase errors cancel.

19 Claims, 6 Drawing Sheets

SYNCHRONIZATION OF WIRELESS TRANSMITTED MRI SIGNALS IN MRI SYSTEM

GOVERNMENT RIGHTS

To be determined.

BACKGROUND OF THE INVENTION

This invention relates generally to magnetic resonance imaging (MRI), and more particularly the invention relates to transmission and phase synchronization of a detected free induction decay (FID) signal to signal processing apparatus in a MRI system.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

FIG. 1A is a perspective view partially in section illustrating conventional coil apparatus in an NMR imaging system, and FIGS. 1B–1D illustrate field gradients which can be produced in the apparatus of FIG. 1A. This apparatus is discussed by Hinshaw and Lent in "An Introduction to NMR Imaging: From the Block Equation to the Imaging Equation," Proceedings of the IEEE, Vol. 71, No. 3, March 1983, pp. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned within the saddle coil 14.

In FIG. 1B an X gradient field is shown which is parallel to the static field B.sub.0 and varies linearly with distance along the X axis but ideally does not vary with distance along the Y or Z axes. FIGS. 1C and 1D are similar representations of the Y gradient and Z gradient fields, respectively.

FIG. 2 is a functional block diagram of conventional imaging apparatus. A computer 20 is programmed to control the operation of the NMR apparatus and process FID signals detected therefrom. The gradient field is energized by a gradient amplifier 22, and the RF coils 26 for impressing an RF magnetic moment at the Larmor frequency are controlled by the transmitter 24. After the selected nuclei have been flipped, the RF coil 26 is employed to detect the FID signal which is passed to the receiver 28 and thence through digitizer 30 for processing by computer 20.

Heretofore, the detected FID signals have been coupled to the signal processor via coaxial cables. However, cable transmission can degrade the detected signal, and coaxial cables require the use of balans for signal coupling. Further, cables present a contamination problem in interventional MRI which requires a sterilized coil.

Wireless transmission of the detected FID signals to the processor has been proposed to eliminate the need for cables. See for example, Leussler U.S. Pat. No. 5,245,288 and Murakami et al. U.S. Pat. No. 5,384,536. Since frequency and phase of the detected signals are critical in signal processing, Leussler proposes transmitting an auxiliary signal from the signal processor to the signal detector for use in a local oscillator for frequency shifting the FID signal for transmission. The processor can then compensate for any phase errors introduced through signal modulation by comparing the received modulation signal to the transmitted auxiliary signal. Since the detector oscillator frequency is generated from this auxiliary signal, it is assumed that no phase errors are incurred.

Murakami et al. propose a similar wireless MRI system which employs a reference signal transmitted from the processor to the detector for use in frequency conversion (modulation) of the detected FID signal for transmission to the processor.

Unfortunately, the detected auxiliary signal suffers fluctuations when received by the detector electronics due, in part, to the relatively high voltage pulses of the MRI pulse sequence RF transmitter modulated FID signal. The phase locked loop driven by the auxiliary signal in controlling the local oscillator suffers instability in operation and requires continual phase locking. This electronics has a finite recovery time and will suffer phase skips due to counting errors in the phase locked loop. Moreover, the extra locking circuitry on the detector adds to the detector complexity.

Basically, whenever a FID signal undergoes a frequency change due to mixing with a local oscillator, a phase shift is created. The present invention is directed to providing wireless transmission of FID signals to a processor which can be readily compensated for phase variations in the FID detector and in transmission.

SUMMARY OF THE INVENTION

In accordance with the invention, a pilot signal is transmitted from the processing unit of a MRI system to the FID detector unit with the pilot signal being processed and modulated along with the FID signal for transmission back to the processing unit. The processing unit can then compensate for phase variations in the FID signal by subtracting the same phase variations in the pilot signal. The pilot signal is not used in a phase lock loop for the modulator local oscillator and thus obviates the periodic loss of phase lock in the prior art systems.

In one embodiment, the pilot signal is broadcast during a FID receive time period and is offset in frequency but near the FID frequency. A transponder in the receiver then up converts the pilot signal along with the FID signal for transmission. The received pilot then becomes a phase reference for the image data with pilot phase variations being subtracted in the FID signal.

In one embodiment, the FID and pilot are up converted by amplitude modulation, with a single side band of the modulated carrier signal being transmitted to the processing unit which recovers both the pilot and FID signal by demodulation. The pilot and FID are then mixed to get a difference signal with phase error cancellation. The difference signal can then be down converted as necessary to get the FID signal. By selecting the difference frequency to be equal to the FID frequency, the down conversion is unnecessary.

The modulation, transmission and reception can employ many well known techniques such as synchronous modulation, single side band transmission, frequency modulation and digital modulation and demodulation with analog and digital receivers.

In one embodiment, the FID and pilot are both frequency translated, and sampled at the detector by an analog to digital converter. Since data sampling is mathematically equivalent to mixing, sampling time errors can create data phase errors. The resulting digital data is sent to the processor. The processor digitally recovers the FID and pilot signals and subtracts the recovered pilot signal phase from the FID to phase correct the data. In this way, not only local oscillator errors, but sampling clock errors on the detector can be corrected.

In a special case, the pilot can be self generated in the detector if the detector's first local oscillator signal is mixed with the FID and simultaneously leaked. The FID then has all the phase errors of the leaked oscillator signal. When both of these signals are ultimately received and demodulated, the leaked oscillator signal acts as the pilot phase reference to correct the FID.

The invention and objects and features thereof will be more readily apparent from the following detailed description and appended claims when taken with the drawings.

DETAILED DESCRIPTION

As above described, wireless transmission of MRI signals is complicated by the need to maintain full phase synchronization between the MRI scanner and a coil transponder. Any local oscillator phase or frequency errors must be eliminated.

Heretofore, the prior art has attempted to eliminate phase errors by applying an auxiliary or reference signal to control a local oscillator for the FID signal modulation. The detection electronics must robustly amplify this auxiliary signal which drives a phase locked frequency synthesizer as the local oscillator.

The present invention employs a pilot signal which can be transmitted from the processing unit to the signal detector during FID signal reception and which is processed and transmitted along with the detected FID signal back to the processing unit. With synchronous demodulation, one side band of the modulated carrier is received and processed. However, the processor unit can electronically lock to the pilot instead of the leaked carrier signal from the detection unit. The received FID and pilot signals are then demodulated, and the phase offset in the recovered pilot is subtracted from the recovered FID signal to correct phase of the FID signal.

The pilot signal can be close to the FID signal in frequency or can occupy a frequency band far from the FID and detected with a separate analog or digital receiver channel. The post processing using the pilot signal eliminates phase locked loop locking time phase errors.

Figure 1A:
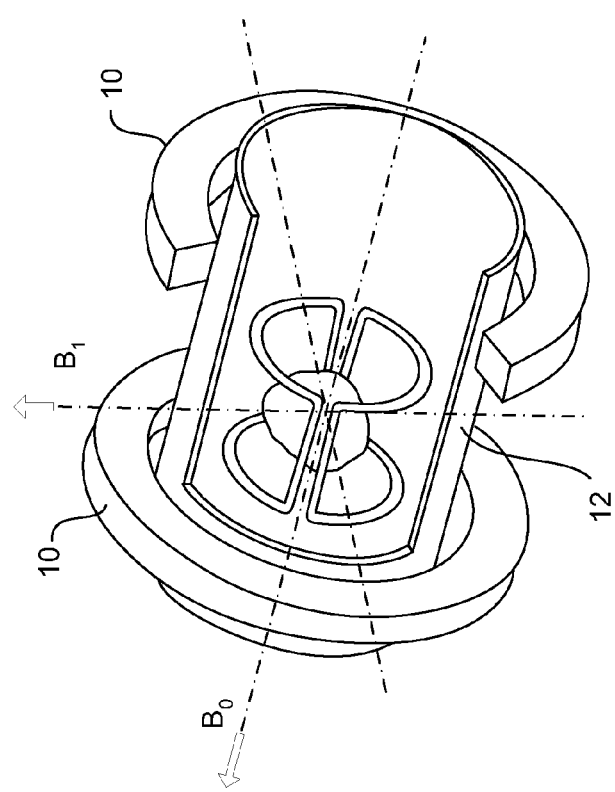
FIG. 1A is perspective view partially in section illustrating conventional coil apparatus in an NMR imaging system.
Figure 1D:
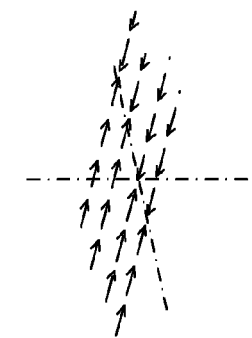
FIGS. 1B–1D illustrate field gradients which can be produced in the apparatus of FIG. 1A.
Figure 1C:
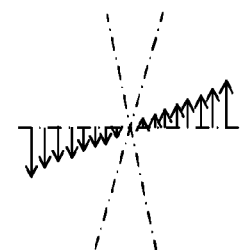
Figure 1B:
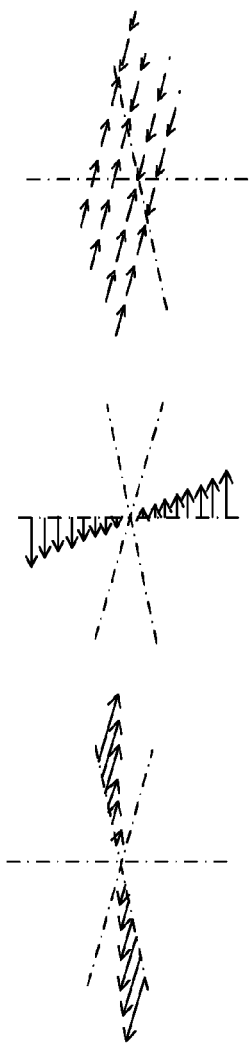
Figure 2:
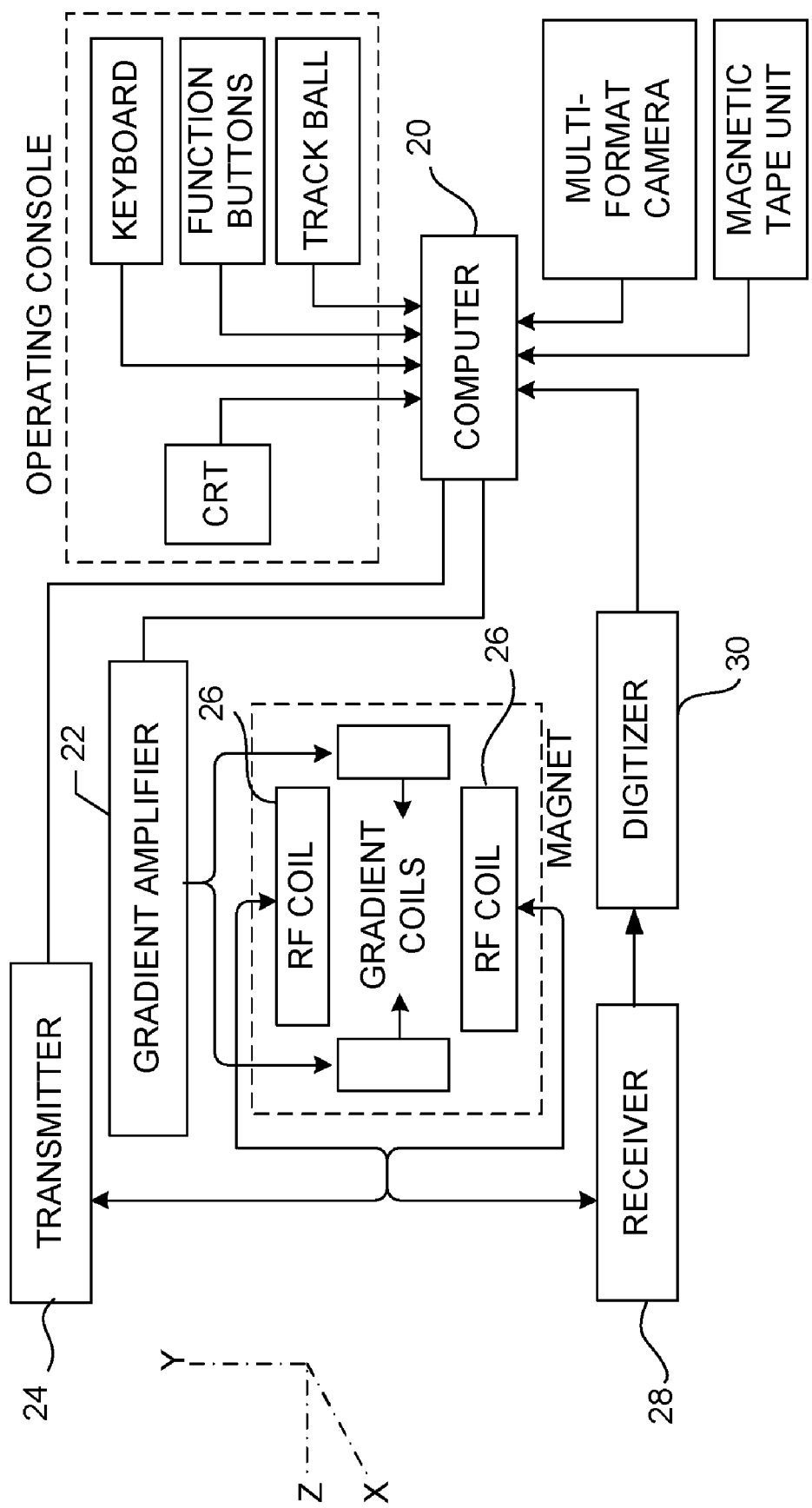
FIG. 2 is a functional block diagram of conventional imaging apparatus.
Figure 3:
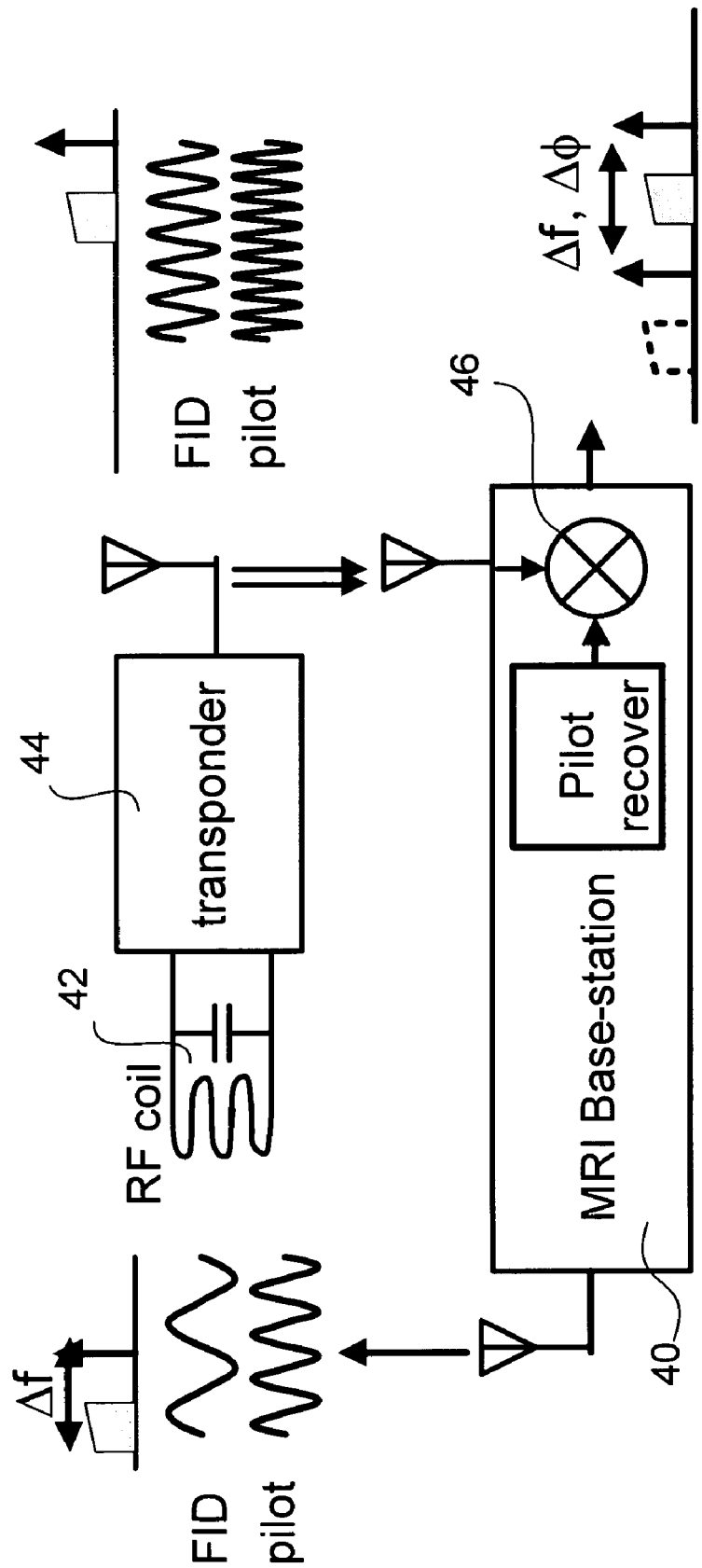
FIG. 3 is a functional block diagram of a signal processing system in accordance with one embodiment of the invention using an analog synchronized pilot signal.

FIG. 3 is a diagram of an analog synchronized pilot as used in one embodiment of the invention. The MRI base station 40 at the processing unit transmits the pilot signal to the FID detection coil 42 during signal acquisition, and coil 42 then detects both the FID signal and the pilot signal. The two signals are then sent to transponder 44, which transmits a single side band of a modulated carrier signal with the FID and pilot signals back to base station 40. The pilot reference has a known frequency offset from the FID frequency, which is 64 MHz for a 1.5 Tesla MRI system.

The MRI base station then recovers the pilot and FID signals by frequency down converting the received modulation side band with mixer 46. Both FID and pilot will have undergone identical phase and frequency errors during modulation and demodulation. The FID signal is recovered by subtracting from the recovered pilot signal the FID frequency, Fp+Δf, and then demodulating the frequency as necessary for the correct FID frequency.

Figure 4:
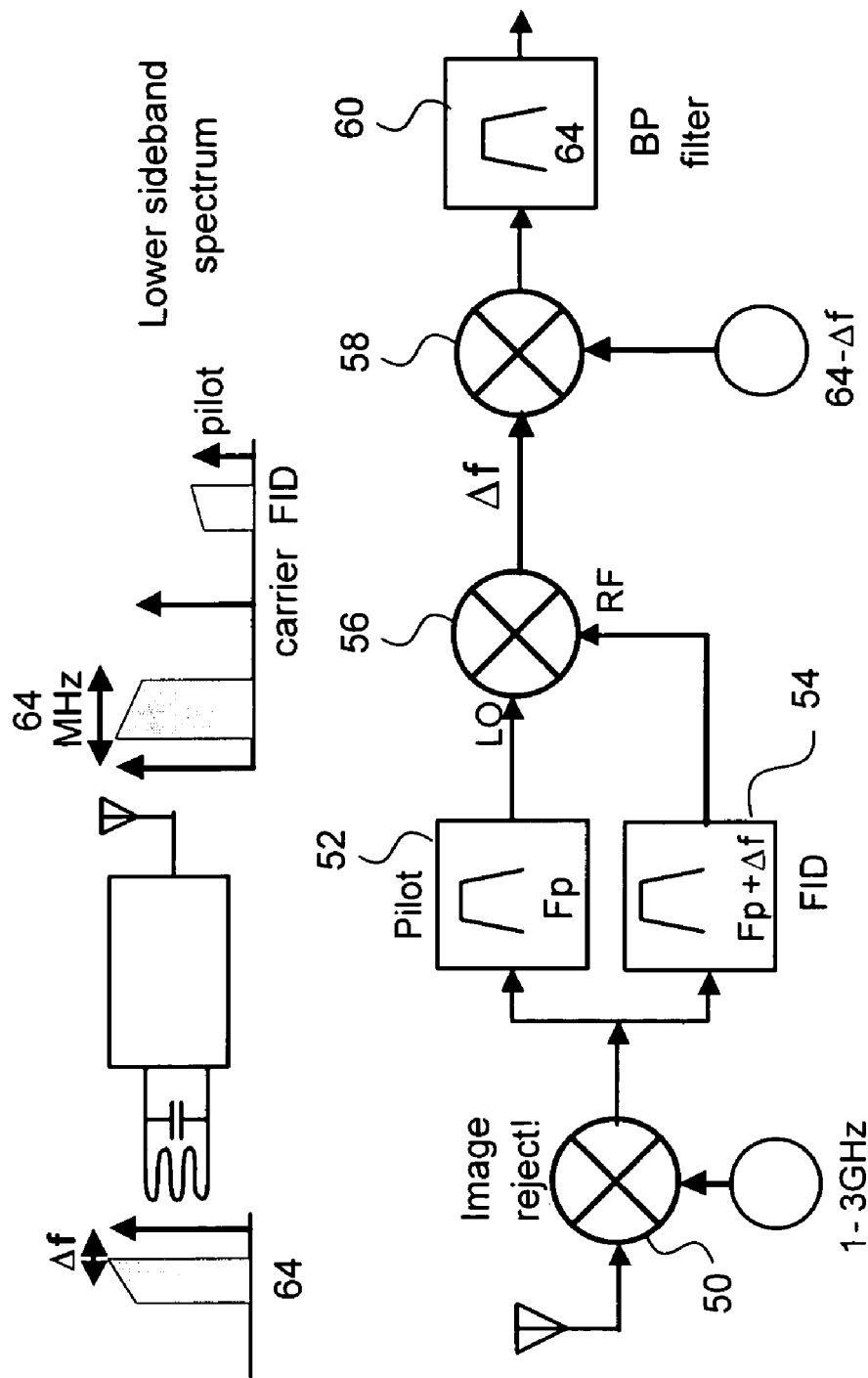
FIG. 4 is a functional block diagram of a signal processing system in accordance with an embodiment of the invention in which a recovered pilot signal is mixed with a recovered FID signal to compensate for phase errors.

This is illustrated in the schematic of FIG. 4. Here, the signal transmitted by the FID detector is down converted at 50 to a convenient frequency range to allow subsequent recovery of the pilot signal, Fp, and the FID signal, Fp+Δf. The down converted signal is passed through filter 52 to recover the pilot, Fp, and filter 54 to recover the FID, Fp+Δf. The two recovered signals are then applied to mixer 56 which produces a difference signal Δf, which is then applied to a second mixer 58 which then frequency shifts the recovered signal to the FID frequency, 64 MHz. for 1.5T. The output of mixer 58 is then applied through filter 60 to recover the 64 MHz signal. By choosing Δf to be 64 MHz, the second mixer 58 is unnecessary.

Thus it is seen that the phase error introduced in the pilot by the FID detector and modulator (transponder) is used to eliminate the corresponding phase error in the FID signal by subtraction of the signals.

Figure 5:
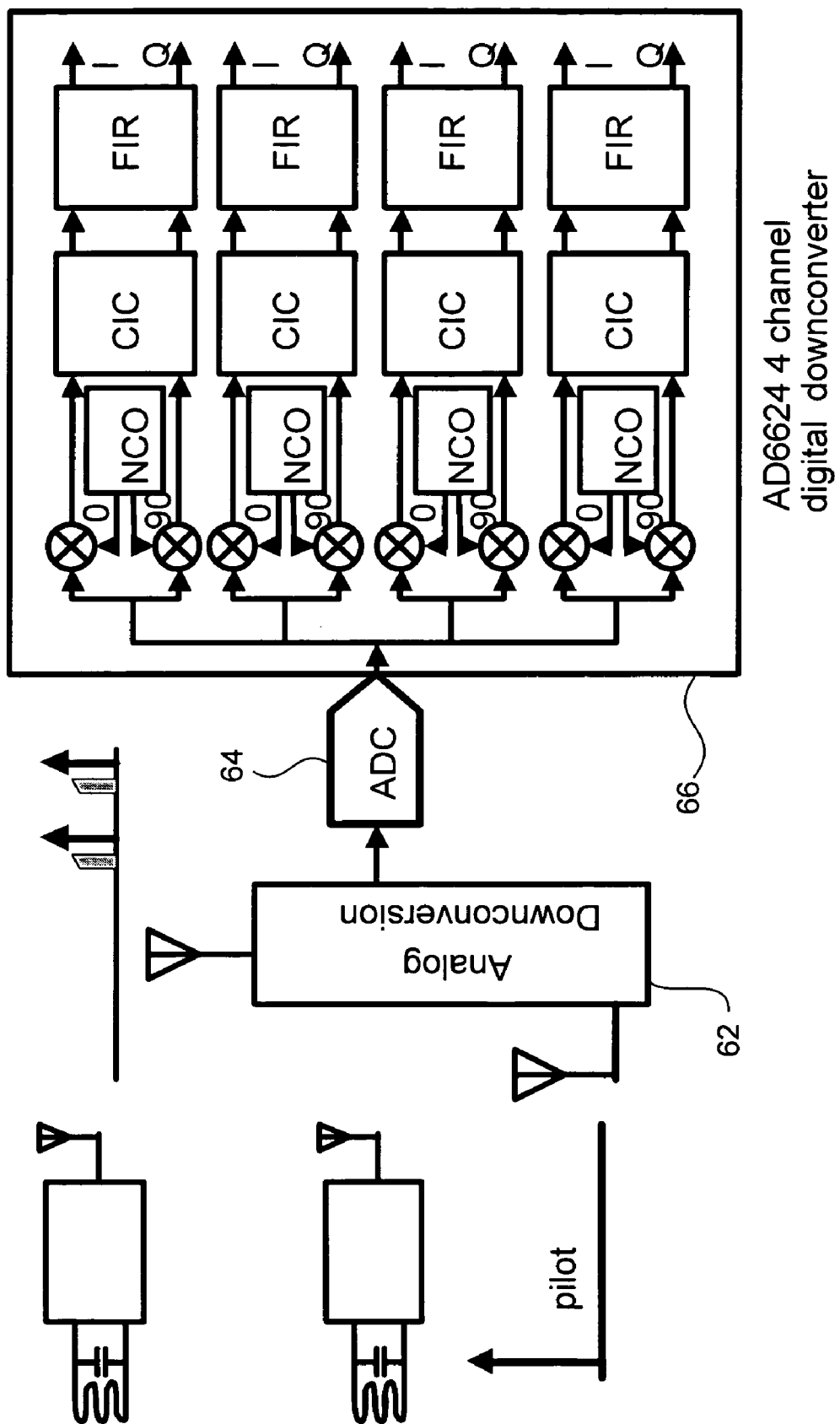
FIG. 5 is a functional block diagram of a signal processing system employing a digital receiver.

Other embodiments of the invention can use other modulation techniques for transmitting the pilot and FID signals to the MRI base station, and other receivers can be employed at the base station for recovering the pilot and FID signal. For example, FIG. 5 is a schematic of a digital receiver which can use two digital receiver channels per transponder for the pilot and for the FID. The received analog signals are down converted at 62 and applied through an analog to digital converter 64 to a four channel digital down converter 66.

Figure 6:
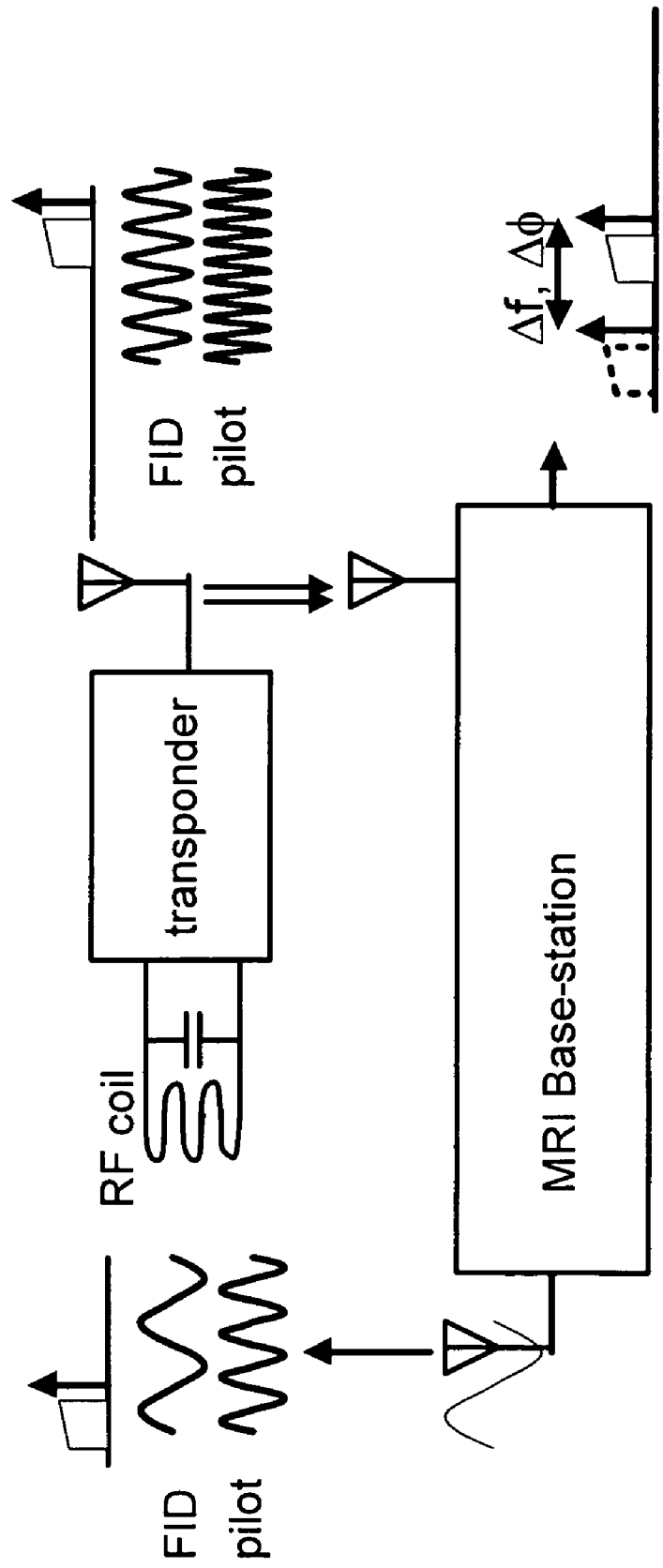
FIG. 6 is a functional block diagram of a signal processing system employing a software filtered pilot.

FIG. 6 is another embodiment of a software filtered pilot receiver at the base station in which the demodulated pilot tone contains all phase and frequency error information. If the pilot frequency is within the image field of view bandwidth, the same digital channel receiver and signal processing can be used so that the phase error in the pilot can be subtracted from the recovered FID signal to correct for phase error.

The invention provides an improved method for correcting phase error in a FID signal through use of a pilot signal broadcast from the computer processor unit base station, but without introducing errors through use of the pilot in a phase locked loop for driving an oscillator in a transponder modulator as in the prior art. Rather, the pilot signal is processed along with the recovered FID signal with phase errors introduced into the FID signal also introduced into the pilot signal. By sending both signals back to the base station and recovering the pilot signal, the phase error introduced by the scanning apparatus can be removed from the FID signal by mixing (subtracting).

While the invention has been described with reference to specific embodiments, the description is illustrative of the invention and is not to be construed as limiting the invention. Various applications may occur to those skilled in the art without departing from the spirit and scope of the invention as defined by the appended claims.

What is claimed is:

1. In a MRI system having a FID detector unit and a computer unit for processing FID signals, a method of correcting for phase errors introduced when processing a FID signal at the detector unit and transferring the processed FID signal from the detector unit comprising:
   a) providing a pilot signal at the detector unit,
   b) detecting the pilot signal and the FID signal at the detector unit,
   c) modulating a carrier signal with the pilot signal along with the detected FID signal at the detector unit for transmission to the processing unit as a single side band of the modulated carrier signal,
   d) receiving and frequency down converting the modulated carrier signal at the computer unit to recover the pilot signal and the FID signal, and
   e) combining the recovered pilot signal and the recovered FID signal whereby phase error is cancelled.

2. The method of claim 1 wherein the pilot signal is generated in the detector.

3. The method of claim 1 wherein the pilot signal is transmitted from the computer unit to the detector.

4. The method of claim 1 wherein step d) includes mixing the recovered pilot signal and the recovered FID signal to obtain a difference frequency $\Delta f$.

5. The method of claim 4 wherein the frequency of the pilot signal is near the frequency of the FID signal.

6. The method of claim 4 wherein frequency of the pilot signal (Fp) is at the difference frequency, $\Delta f$, from the frequency of the FID signal (Fp+$\Delta f$).

7. The method of claim 6 wherein the difference frequency signal ($\Delta f$) is mixed with a signal at the frequency of the FID signal offset by the difference frequency thereby obtaining an output signal at the frequency of the FID signal.

8. The method of claim 7 wherein the signal at the frequency of the FID signal offset by the difference frequency is less than the frequency of the FID signal.

9. In a MRI system having a FID detector unit and a computer unit for processing FID signals, a method of correcting for phase errors introduced in the FID signal at the detector unit comprising the steps of:
   a) providing a pilot signal at the detector unit,
   b) processing with a carrier signal the pilot signal along with a detected FID signal at the detector unit for transmission to the computer unit, and
   c) recovering the pilot signal and FID signal at the computer unit,
   d) using phase of the pilot signal transmitted by the detector unit as an error signal in correcting for phase error introduced into the FID signal at the detector unit.

10. The method of claim 9 wherein the pilot signal is generated in the detector.

11. The method of claim 9 wherein the pilot signal is transmitted from the computer unit to the detector.

12. The method of claim 9 wherein step c) includes use of a transponder for modulating and transmitting the pilot signal and the FID signal to the computer unit.

13. The method of claim 12 wherein step d) includes obtaining a difference between the pilot signal and the FID signal.

14. The method of claim 13 wherein the recovered FID signal and the recovered pilot signal transmitted by the detector unit are each frequency down converted.

15. The method of claim 14 wherein step c) includes mixing the recovered pilot signal and the recovered FID signal to obtain a difference frequency signal.

16. The method of claim 15 wherein frequency of the pilot signal is at a difference frequency, $\Delta f$, from the frequency of the FID signal.

17. The method of claim 16 wherein the difference frequency signal is mixed with a signal at the frequency of the FID signal offset by the difference frequency thereby obtaining an output signal at the frequency of the FID signal.

18. The method of claim 17 wherein the signal at the frequency of the FID signal offset by the difference frequency is less than the frequency of the FID signal.

19. The method of claim 9 wherein step b) uses analog to digital signal conversion.

* * * * *